United States Patent [19]

Crosby

[11] 4,357,061
[45] Nov. 2, 1982

[54] ELECTRO-MECHANICAL PACKAGE OF VISUAL DISPLAY AND RELATED CIRCUITRY

[75] Inventor: John B. Crosby, Yorba Linda, Calif.

[73] Assignee: Beckman Instruments, Inc., Fullerton, Calif.

[21] Appl. No.: 125,812

[22] Filed: Feb. 28, 1980

[51] Int. Cl.³ .............................................. H01R 13/54
[52] U.S. Cl. .............................. 339/17 C; 339/75 MP; 339/DIG. 3
[58] Field of Search ............. 339/17 C, 17 L, 17 LC, 339/17 LM, 17 M, 18, 75 MP, 176 MP, DIG. 3

[56] References Cited

U.S. PATENT DOCUMENTS

| | | | |
|---|---|---|---|
| 2,169,708 | 8/1939 | O'Callaghan | 24/213 |
| 3,240,885 | 3/1966 | Grunfelder et al. | 339/18 C |
| 3,335,327 | 8/1967 | Damon et al. | 317/101 |
| 3,718,842 | 2/1973 | Abbott et al. | 317/101 |
| 3,719,917 | 3/1973 | Fischer et al. | 339/17 CF |
| 3,863,436 | 2/1975 | Schwarzchild et al. | 58/50 R |
| 4,018,494 | 4/1977 | Scheingold et al. | 339/17 CF |
| 4,052,118 | 10/1977 | Scheingold et al. | 339/17 CF |
| 4,132,984 | 1/1979 | Gross | 350/336 |
| 4,144,648 | 3/1979 | Grovender | 339/DIG. 3 |
| 4,165,607 | 8/1979 | Fedorowicz et al. | 58/50 R |

Primary Examiner—Joseph H. McGlynn
Attorney, Agent, or Firm—R. J. Steinmeyer; F. L. Mehlhoff; T. J. Plante

[57] ABSTRACT

An electro-mechanical package is disclosed which includes an LCD and an IC chip mounted on opposite sides of a PC board by common package-retaining means, which includes posts extending through the PC board and a clip member that latches onto the ends of the posts to retain the package in assembled position. The latching action is resilient and permits non-destructive disassembly.

17 Claims, 9 Drawing Figures

ELECTRO-MECHANICAL PACKAGE OF VISUAL DISPLAY AND RELATED CIRCUITRY

BACKGROUND OF THE INVENTION

This invention relates to an electro-mechanical package which integrates an electronic visual display and its related circuitry into a single, self-contained assembly. This invention concerns the general class of devices which take in electrical signals, process them electrically, and then display the results visually.

Existing schemes for the electrical interconnection of liquid crystal displays and their associated drive circuitry are generally cost-ineffective for systems of moderate complexity. Non-dedicated approaches use unrelated display and chip sockets with much additional hardware, resulting in high component and assembly labor costs.

Directly wire-bonding chips and other components to L.C.D. substrates represent the ultimate in simplicity and low parts count, but only at the expense of compounded yield-loss problems.

On one hand, there is the desire to have a well-integrated package which constitutes a relatively complete and minimally complex structure. On the other hand, there is the somewhat conflicting desire to insure ready repairability, and reduce throw-away losses, by permitting disassembly for removal of defective individual components.

The present invention aims to meet both of these somewhat disparate goals, while at the same time minimizing the number of parts in the package, and providing simple, relatively inexpensive parts which are easily assembled. The overall result combines cost reduction with functional reliability.

SUMMARY OF THE INVENTION

The present invention provides an electro-mechanical package, or single assembly, comprising three primary components, or modules: a readout device, preferably in the form of a liquid crystal display; an active electronic circuit in the form of an integrated circuit; and a structure, such as a printed circuit board, which has the dual purpose of providing electrical interconnection with external elements and of supporting the electro-mechanical package.

The separate display and integrated circuit components are secured to the printed circuit board in aligned, electrically contacting relationship by a retaining means common to both the display component and the integrated circuit component, which components in the preferred version of the invention are located on opposite sides of the printed circuit board.

The particular structure disclosed also has several more specific features which contribute to the simplicity and cost-effectiveness of the package. Among these is the effective use of the available resilience of molded plastic, retaining and guiding elements to simplify both the manufacturing of the components and the assembling of the package.

DETAILED DESCRIPTION OF PREFERRED EMBODIMENT

Figure 1:
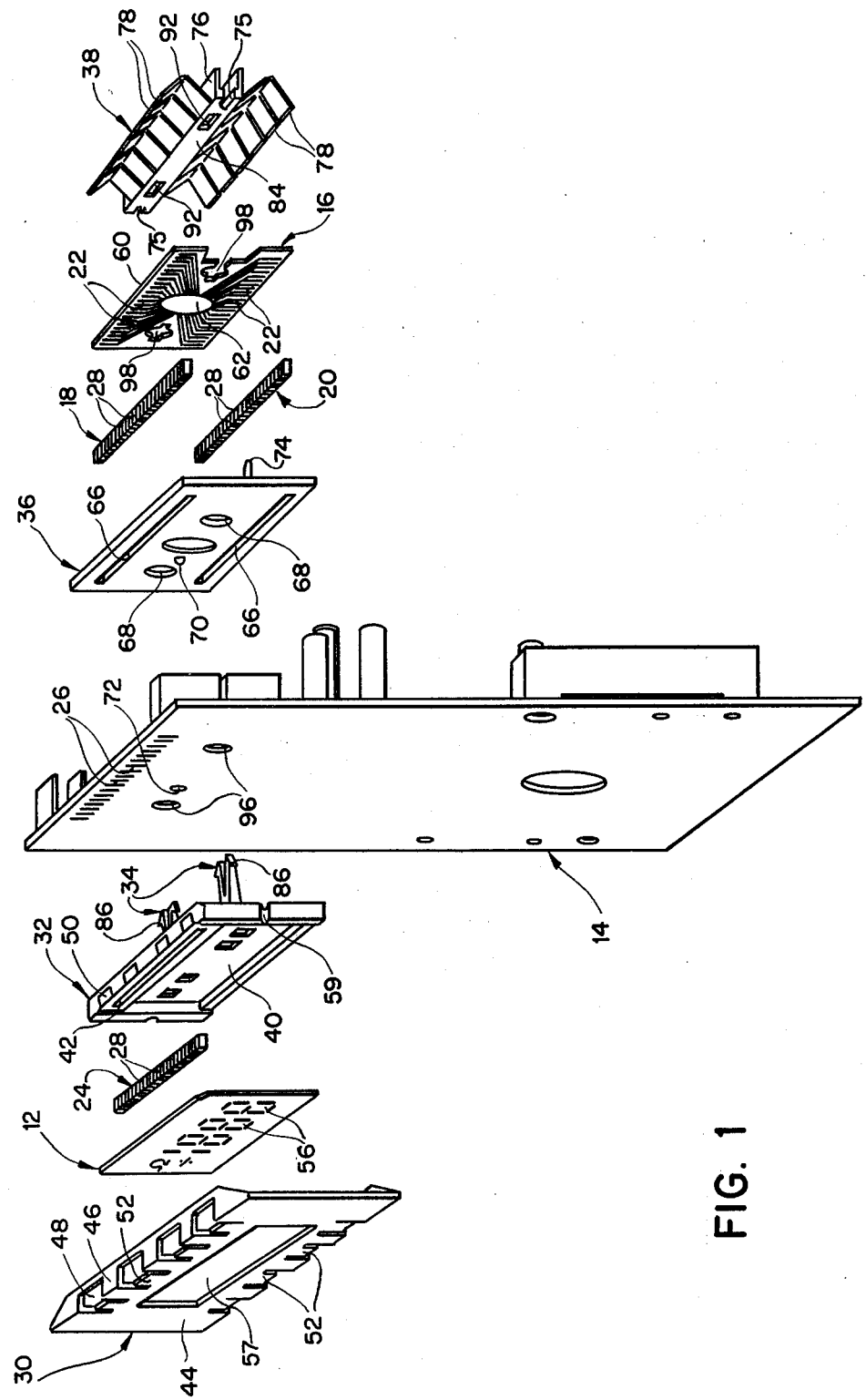
FIG. 1 is an exploded view of the parts which are combined to provide the improved electro-mechanical package.

As seen most clearly in FIG. 1, the entire package may be provided using only a small number of elements which are either readily available or are relatively easy and inexpensive to manufacture. In the illustrated version of the invention, there are ten elements—three of which are the basic electronic components mentioned above (LCD, integrated circuit chip, and PC board); three of which are simple elastomeric connector strips, or "zebras", which electrically interconnect the basic electronic components; and four of which are package-retaining parts, preferably formed of molded plastic.

The three basic electronic components, or modules, are the LCD 12, the PC board 14, and the integrated circuit chip 16. In the preferred form of the invention, as shown, the LCD 12 and chip 16 are located on opposite sides of the PC board 14, which serves as the supporting member for the package, as well as providing electrical connections with external elements. Additionally, the PC board 14 may carry various passive electronic components and the circuitry necessary to interconnect the chip 16 and LCD 12. It would be feasible to have both the chip 16 and LCD 12 on the same side of the PC board, in which case their terminals would be directly interconnected, but for most installations the illustrated version is preferable. This is true because of the desire to provide ready access to the chip 16 if replacement is required.

Electrical interconnection between the terminals on the chip and those on one side of the PC board, and between the terminals on the LCD and those on the other side of the PC board, is conveniently obtained by using elastomeric (rubber-like) strips which comprise alternate layers of conductive and non-conductive material in which the layers are perpendicular to, and are compressed somewhat between, two spaced flat surfaces having electrical terminals, with the result that pairs of aligned terminals on the two flat surfaces are in electrically conducting relation with one another, while remaining insulated from all the other terminals. Such strips are commonly referred to as "zebras" because of their uniformly striped patterns. Use of such elastomeric strips eliminates the need for wire bonding, with its attendant manufacturing difficulties.

In the present package, three such elastomeric strips are used. Two strips 18 and 20 connect the respective terminals 22 on chip 16 to aligned terminals provided by printed circuits on the side of the PC board 14 not visible in FIG. 1. A single strip 24 connects the respective terminals 26 formed on the other side of the PC board 14 to aligned terminals formed on the side of LCD 12 not visible in FIG. 1. The dark parallel lines 28 extending across each of the strips 18, 20 and 24 represent the electrically conducting layers of the elastomeric material.

No effort has been made in the drawings to show specific circuitry on the PC board 14. It will be recognized that complex conductor patterns will be formed on both sides of the board in the manner and for the purposes well known in the art. Additionally various holes (not shown) in the board will be plated-through with conducting material to interconnect conductive pads formed on opposite sides of the board. Also, the board provides a convenient base for a plurality of larger electrical components, such as those shown in outline in FIG. 1.

The remaining four elements—the molded plastic "retaining" elements—are primarily responsible for the simplicity and cost-effectiveness of the package. Both the LCD and the chip need to be properly supported and aligned in the package; and the entire assembly needs to be effectively held in engagement with the PC board, both in horizontal position and in vertical position.

The four plastic retaining elements used in the preferred embodiment are as follows: An LCD cover, or retainer, 30 engages the front of LCD 12 and retains it in the package with resilient fingers. An LCD connector, or insulating holder, 32 retains the LCD 12, guides the elastomeric strip 24, and carries a plurality of posts, or guide pins, 34 which are of primary importance both in aligning the elements of the package and in holding them in tight engagement with one another. A chip connector, or insulating holder, 36 receives the chip 16 and guides the two elastomeric strips 18 and 20. And a chip retainer, or clip, 38 locks into position on the posts 34 to retain the chip 16 in the package under the pressure of resilient legs, while at the same time providing, in cooperation with posts 34, the latching, or retaining, means which holds the entire package in its assembled position on the PC board.

The four molded plastic elements—30, 32, 36 and 38—are shown individually in cross section in FIGS. 2-7. They are each formed by a suitable manufacturing process, such as injection molding. The material used is any plastic which, in addition to its processing qualities, has sufficient resilience where required and provides electrical insulation. Various thermoplastic materials would be suitable, but one which has proved particularly desirable for this usage is a polycarbonate including 10% glass fiber reinforcement. For manufacturing economy, the four plastic elements may all be molded from the same "tree" in a single molding step.

For convenience of description, it is desirable to first deal simultaneously with the elements which constitute the LCD supporting, or retaining, component, or module, and then deal simultaneously with the elements which constitute the IC chip supporting or retaining component, or module.

Figure 3:
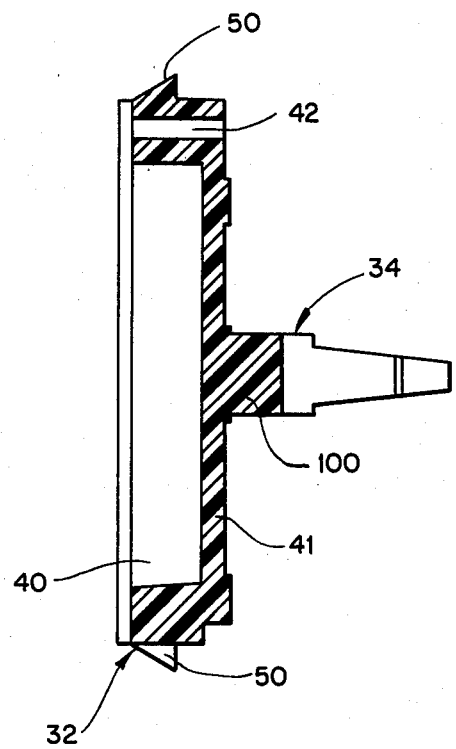
Figure 6:
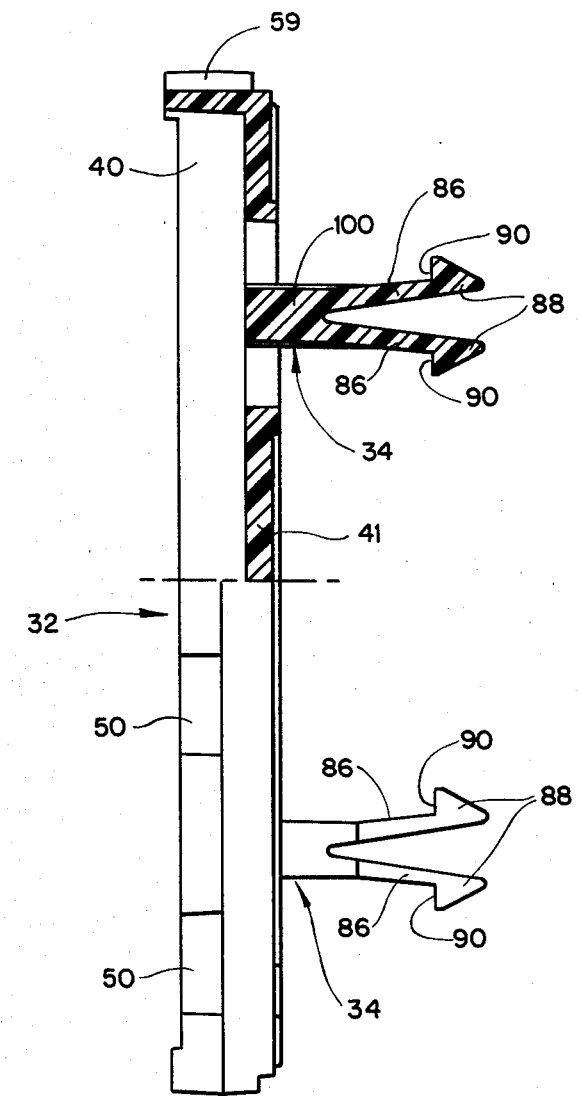
FIG. 6 is a cross-sectional view taken across the larger dimension of the LCD supporting connector which provides the package-aligning means.
Figure 8:
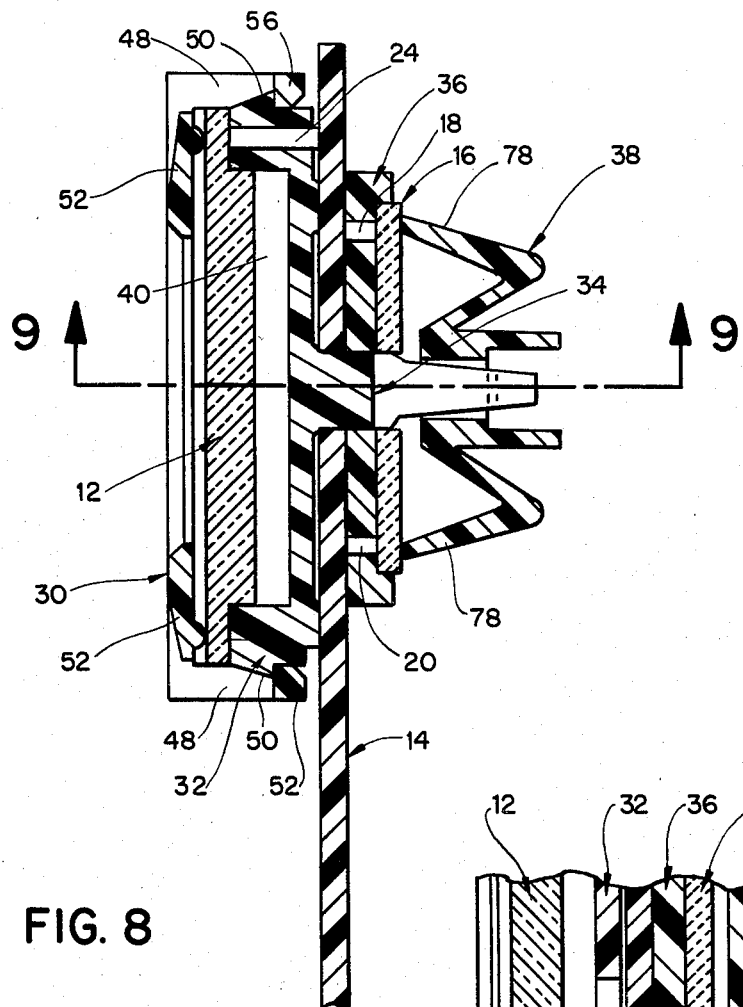
FIG. 8 is a cross-sectional view of the assembled package taken across the smaller dimension of the molded plastic parts.

Referring to FIGS. 3 and 6, as well as FIGS. 1 and 8, we note that the LCD element 12 in assembled position is guided by fitting into a flat oblong recess 40 provided in the plastic LCD supporting element, or insulating holder, 32. Element 32 also has a longitudinal slot 42 extending through its upper edge, in which the elastomeric strip 24 is guided. Its guidance in slot 42 retains one longitudinal edge of strip 24 in engagement with the row of terminals 26 on PC board 14 and retains the other longitudinal edge of strip 24 in engagement with the row of terminals on the underside of LCD element 12.

LCD holder 32 also conveniently carries the integrally formed posts 34 which are used both in aligning the LCD component to the PC board and in retaining, or "capturing", the entire assembled package.

Figure 2:
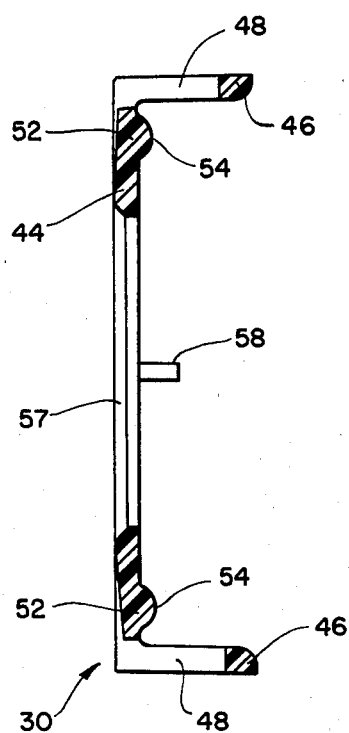
FIGS. 2, 3, 4 and 5 are cross-sectional views, respectively, of the four molded plastic parts used in the package, taken across the smaller dimension of each part, and shown in the following order: (2) a retainer, or cover, for the liquid crystal display (LCD), (3) a connector, or guide, which supports the LCD and provides aligning and interconnecting means for the package, (4) a connector, or guide, which aligns the integrated circuit substrate (chip), and (5) a retainer, or clip, which engages the chip and holds the package in assembled relationship.

The other element of the LCD portion of the package is plastic LCD cover 30, seen separately in cross section in FIG. 2. The LCD cover 30 has a flat frame 44, on which are formed flanges 46 extending rearwardly from its upper and lower longitudinal edges. These flanges each have a plurality of spaced openings 48 which fit, respectively, over aligned projections 50 (see FIGS. 1 and 3) formed on the upper and lower longitudinal peripheral edges of LCD holder 32, for the purpose of clamping the subassembly elements together. The lateral flexibility of the two flanges 46 permits them to deflect as they ride along the sloping surfaces of projections 50, until they snap into place, with each projection 50 inside its corresponding opening 48.

In order to retain LCD 12 between holder 32 and cover 30 with an effectively distributed resilient pressure, a plurality of integral spring fingers 52 are formed opposite openings 48. Each finger 52 has a raised portion 54 which engages the face of LCD 12. The inherent resiliency of fingers 52 permits retention pressure against the LCD in its assembled position to be yieldingly exerted at well-distributed points near its upper and lower edges. The primary purpose of this distributed resilient pressure is to retain the conductors in strip 24 in effective electrical conduction between the terminals which it interconnects. Another purpose of the resilient pressure is to prevent damage in case the unit is accidentally dropped.

In order to permit viewing the digital display numerals 56 of the LCD, the flat frame 44 of cover 30 has an oblong opening 57. Alignment of cover 30 with holder 32 is further assured by two bosses 58 on opposite ends of cover 30 which fit respectively into two slots 59 formed on opposite ends of holder 32.

The holder 32 and cover 30 are snapped together with LCD 12 in place between them, in order to constitute a subassembly of the final package. Elastomer strip 24 is fitted into slot 42 before the subassembly is secured to PC board 14.

The elements on the other side of the PC board will now be described. The integrated circuit chip 16 comprises a substrate 60 which carries the integrated circuit 62 and the conductors which lead from the integrated circuit to the terminals 22. Opposite ends of substrate 60 have differently sized cutouts, so that its position cannot be accidentally reversed during the assembling process.

Figure 4:
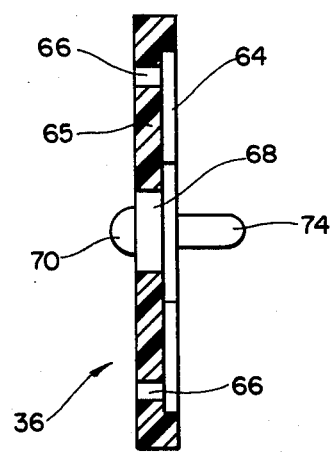

As shown in FIG. 4, the chip connector, or insulating holder, 36 is a simple molded plastic element having a recess 64 formed in its body 65 to receive the periphery of chip substrate 60 and having longitudinally extending upper and lower slots 66 therethrough which hold the elastomeric strips 18 and 20. In order to align the chip holder 36 in the final assembly, two openings 68 are formed therein, through which the posts 34 extend when the elements are in assembled position. In order to insure proper assembling, a small, off-center projection 70 on the side of guide element 36 adjacent the PC board 14 is adapted to fit into an opening 72 formed in the latter. Also two projecting pins 74 formed at opposite ends of guide 36 and located on the side facing away from the PC board are provided to assist in aligning holder 36 with clip 38. As seen in FIG. 1, retaining clip 38 has two slots 75 formed in its opposite ends, the bottom surfaces of which are designed to fit pins 74.

The final molded plastic element in the package is the chip retainer, or clip, 38 which presses resiliently against the substrate 60 to hold it in position and also, in cooperation with the pronged ends of posts 34, "captures", or latches, the ends of the posts to hold the entire package together and retain the elements in assembled position.

Figure 5:
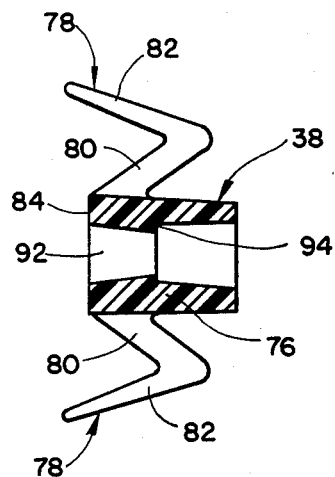
Figure 7:
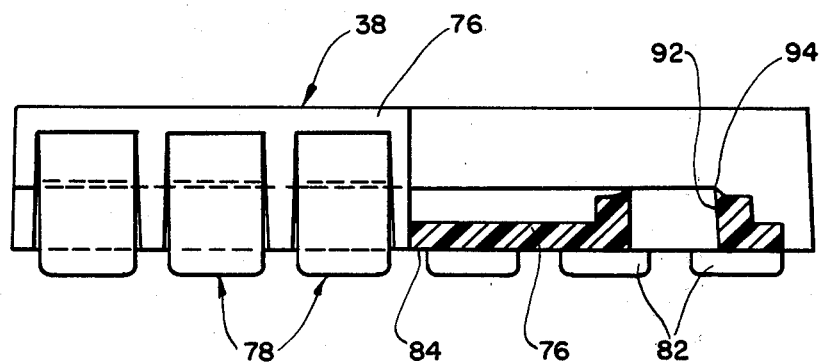
FIG. 7 is a cross-sectional view taken across the larger dimension of the clip which holds the package in assembled relationship.

Plastic clip 38, which is shown separately in FIGS. 5 and 7, has a longitudinally extending channel-like body portion 76 which has a plurality of spider-like resilient legs 78 extending laterally therefrom, half of the legs 78 being located on one side of the body portion and the other half being located on the other side. As seen in FIGS. 1 and 5, each of the legs 78 is substantially "V-shaped" in cross section, the inner portion 80 of the "V" being attached to the body 76 and the outer portion 82 of the "V" extending somewhat past the end surface 84 of the body 76. When the surface 84 is in assembled position against the adjacent surface of substrate 60, the legs 78 are forced to flex, thereby developing a resilient pressure on the other parts in the package. The separate fingers 78 are spaced along the upper and lower surfaces of the substrate for the purpose of distributing the pressure effectively by providing localized pressure-exerting springs. The pressure thus exerted provides enough compression across the elastomeric strips 18 and 20 to maintain effective electrical conduction between the terminals 22 on the substrate 60 and the terminals on the facing side of PC board 14.

The V-shape of the resilient legs 78 provides roughly twice the length of laterally flexing material, as compared with legs extending only in one direction and confined to the same overall depth. In order to obtain sufficient flexibility, in view of the modulus of elasticity of the plastic material, the V-shaped cross section, or profile, is highly advantageous.

Referring now to the simple arrangement for retaining the entire assembled package in engagement, we note that, extending perpendicularly from LCD holder 32, each of the posts 34, at its outer end, is formed with two prongs, or fork tines, 86. As seen clearly in FIG. 6, the prongs 86, in their original, unassembled position, diverge outwardly and terminate in latches, or hooks, 88, each of which has an outwardly projecting flange terminating in a latching surface 90 facing the body 41 of holder 32. The resilience of the molded plastic material permits the prongs on each arm to move closer together during the assembling process and then snap outwardly to complete the latching process.

The cooperating member in the latching process is clip 38, which has two oblong openings 92 in the base of its channel-shaped body 76, through which the prongs 86 of the respective posts 34 are forced as the package is assembled. As seen in FIG. 7, the openings 92 preferably have sloping end surfaces to facilitate motion of the prongs through the openings. Once the ends of prongs 86 clear the surfaces 94 surrounding the outer edges of openings 92, the resilience of prongs 86 automatically snaps them apart. Then the surfaces 90 on the prongs engage the surfaces 94 on the clip 38 to prevent disassembly of the package.

Disassembly can be accomplished by using suitable tools to squeeze the prongs together while clip 38 is lifted out of its latching position. In fact, simple disassembly is an important advantage of the package because it permits defective parts to be removed and replaced without discarding the entire package. The part most likely to require replacement is the IC chip 16.

From the foregoing description, it will be apparent that the assembling process is a simple one. First the LCD 12 is placed in recess 40 of LCD holder 32. Then cover 30 is pushed onto holder 32 until openings 48 engage projections 50. This provides an LCD subassembly in which distributed resilient pressure is exerted by fingers 52 against the face of the LCD. Before assembling the subassembly to the PC board, elastomeric strip 24 is placed in slot 42 provided in member 32.

Next, the subassembly is aligned to PC board 14 by inserting the two posts, or guide pins, 34 through two guiding openings 96 provided in the PC board. Then chip holder 36 is added to the assembly on the other side of the PC board by inserting the two posts 34 through the two openings 68 provided in member 36. The two elastomer strips 18 and 20 are placed in the respective slots 66 in holder 36, after which the chip member 16 is placed in recess 64 in holder 36. The prongs on the ends of posts 34 pass through two openings 98 provided in substrate 60.

Finally, the clip, or retainer, member 38 is pushed onto the package, the prongs 86 on posts 34 being squeezed together as they pass through the respective openings 92 in clip member 38. Once the hooks 88 on the prongs 86 clear the surfaces 94 on the body of the clip member 38, the prongs automatically snap into latching position.

The posts 34 perform the additional function of guiding and aligning the members of the package. This is accomplished by providing a close fit between the lower body portions 100 of the respective posts and the holes through which they extend, i.e., the holes 96 in the PC board 14 and the holes 68 in holder 36. The lower body portion 100 of each post 34 has a cylindrical portion which fills the aligned holes; this is clear in the cross section of FIG. 3. In the cross section of FIG. 6, which shows the two prongs of each post, the diameter of the lower body portion 100 of the post is reduced.

Figure 9:
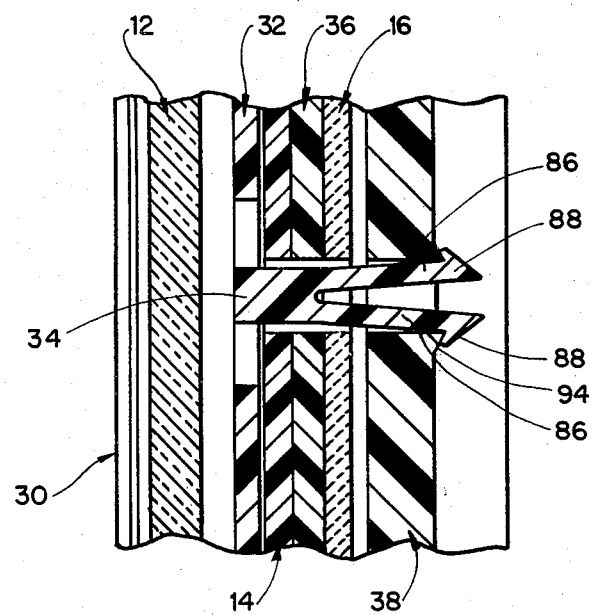
FIG. 9 is a cross-sectional view of the assembled package taken on line 9—9 of FIG. 8.

FIGS. 8 and 9 show the assembled structure. On the left of PC board 14 is the visual display component, or module, comprising the LCD holder 32 adjacent the PC board, the liquid crystal display member 12 extending into recess 40 in holder 32, and the cover member 30 having its spring fingers 52 pressing against the face of the LCD member 12, thereby exerting compressive pressure on elastomeric strip 24. The flanges 46 of cover member 30 are snapped into place on LCD holder 32, with projections 50 on holder 32 extending into openings 48 in flanges 46.

On the right side of PC board 14 is the integrated circuit component, or module, comprising the chip holder 36 adjacent the PC board, the IC chip member 16 extending into recess 64 in holder 36 and the clip member 38 having its spring legs 78 pressing against the surface of chip member 16, thereby exerting compressive pressure on elastomeric strips 18 and 20.

Each post 34, as shown in FIG. 8, extends through closely fitting openings in PC board 14, chip holder 36, and IC chip member 16, thereby aligning the components of the package. As shown in FIG. 9, the hooks 88 on the ends of prongs 86 extending from each post 34 are in latching position against the surface 94 on clip 38.

The assembly described herein is a conveniently packaged combination, easy to handle, and convenient to use in conjunction with exterior hardware. In an inexpensive package, having a small number of parts, a complete system is provided which can be easily assembled, and disassembled if necessary, without damaging the parts. Using a small number of low-cost, molded plastic parts, a simple electrical interconnection is provided which permits replacement of major components within a relatively complex system. The fact that the hardware is centered on a "mother" PC board allows easy interfacing with other parts of larger electronic systems.

The following claims are intended not only to cover the specific embodiments disclosed, but also to cover the inventive concepts explained herein with the maximum breadth and comprehensiveness permitted by the prior art.

What is claimed is:

1. An electro-mechanical package comprising:
   a visual display component having an electronically controlled display panel supported therein;
   an integrated circuit component having a substrate carrying integrated electronic circuitry arranged to control the display panel;
   a supporting member comprising a printed circuit board adapted to support both components and having circuitry which interconnects the circuitry in the package with external circuitry;
   the visual display component and the integrated circuit component being mounted on opposite sides of the supporting member; and
   package-retaining means common to the visual display and integrated circuit components and extending through the supporting member to secure both components in properly aligned, electrically conducting relationship with the supporting member.

2. The electro-mechanical package of claim 1 wherein the visual display component comprises:
   a liquid crystal display member having electrical terminals thereon facing the PC board;
   an LCD holder having a body portion between the liquid crystal display member and the printed circuit board and having a recess therein to receive the liquid crystal display member; and
   means also supported by the LCD holder for electrically interconnecting the individual terminals on the display member with the circuitry on the printed circuit board.

3. The electro-mechanical package of claim 2 which also comprises:
   a cover member fitting over the LCD holder and having an opening through which the liquid crystal display is viewed;
   said cover member and LCD holder having interengaging latching surfaces, one of which is resiliently displaceable, whereby the cover member and LCD holder may be pushed together until they latch in assembled position.

4. The electro-mechanical package of claim 3 wherein the electrically interconnecting means comprises:
   an elastomeric strip providing alternate layers of conducting and non-conducting material extending perpendicularly to those surfaces of the liquid crystal display member and printed circuit board which face one another.

5. The electro-mechanical package of claim 4 wherein the cover member has a plurality of spaced spring fingers which resiliently press on the face of the liquid crystal display member to provide widely distributed, independently sprung pressures thereon, thereby exerting a compressive force on the perpendicularly extending layers of the elastomeric strip.

6. The electro-mechanical package of any one of claims 1 through 5 wherein the package-retaining means comprises:
   a plurality of perpendicularly extending posts mounted on one of the components and extending through holes in the printed circuit board and in the other component, the posts having a close fit in their respective holes to provide alignment of the components with the printed circuit board; and
   latching means including a retaining member and means on the ends of the posts for retaining the components in assembled position on the printed circuit board after the retaining member has been placed in engagement with the posts.

7. The electro-mechanical package of claim 6 wherein the posts are formed integrally with one of the members of the visual display component, and the retaining member is part of the integrated circuit component.

8. The electro-mechanical package of claim 6 wherein the retaining member has openings through which the ends of the respective posts extend and wherein the latching means comprises:
   laterally resilient prongs on the ends of the posts; and
   surfaces on the retaining member which urge the prongs together as the retaining clip is placed in engagement with the prongs and which thereafter lock the prongs in position to prevent disassembly.

9. The electro-mechanical package of claim 1 wherein the integrated circuit component comprises:
   an insulating substrate member carrying integrated electronic circuitry and having terminals thereon leading from said circuitry, said terminals facing the printed circuit board;
   a chip holder having a body portion between the terminal-carrying face of the substrate member and the printed circuit board and having a recess therein to receive the substrate member; and
   means also supported by the chip holder for electrically interconnecting the individual terminals on the substrate member with the circuitry on the printed circuit board.

10. The electro-mechanical package of claim 9 which also comprises:
    a retaining member which engages the non-terminal-carrying side of the substrate member to exert retaining force against the substrate member and the chip holder, thereby holding them in position on the printed circuit board.

11. The electro-mechanical package of claim 9 wherein the package-retaining means comprises:
    a plurality of perpendicularly extending posts mounted on one of the components and extending through holes in the printed circuit board and in the other component, the posts having a close fit in their respective holes to provide alignment of the components with the printed circuit board; and
    latching means including a retaining member and means on the ends of the posts for retaining the components in assembled position on the printed circuit board after the retaining member has been placed in engagement with the posts.

12. The electro-mechanical package of claim 11 wherein the retaining member has openings through which the ends of the respective posts extend and wherein the latching means comprises:
   laterally resilient prongs on the ends of the posts; and
   surfaces on the retaining member which urge the prongs together as the retaining clip is placed in engagement with the prongs and which thereafter lock the prongs in position to prevent disassembly.

13. The electro-mechanical package of claim 10 wherein the electrically interconnecting means comprises:
   an elastomeric strip providing alternate layers of conducting and non-conducting material extending perpendicularly to those surfaces of the substrate member and the printed circuit board which face one another.

14. The electro-mechanical package of claim 13 wherein the retaining member has a plurality of spaced spring legs which resiliently press on the face of the substrate member to provide widely distributed, independently sprung pressures thereon, thereby exerting a compressive force on the perpendicularly extending layers of the elastomeric strip.

15. The electro-mechanical package of claim 14 wherein the spring legs on the retaining member are essentially V-shaped, thereby increasing the effective length of the resilient legs within a given dimension perpendicular to the printed circuit board.

16. The electro-mechanical package of any one of claims 9, 14 or 11 wherein the package-retaining means comprises:
   a plurality of perpendicularly extending posts mounted on the visual display component and extending through holes in the printed circuit board and in the integrated circuit component, the posts having a close fit in their respective holes to provide alignment of the components with the printed circuit board; and
   latching means including the retaining member and means on the ends of the posts for retaining the components in assembled position on the printed circuit board after the retaining member has been placed in engagement with the posts.

17. The electro-mechanical package of claim 16 wherein the retaining member has openings through which the ends of the respective posts extend and wherein the latching means comprises:
   laterally resilient prongs on the ends of the posts; and
   surfaces on the retaining member which urge the prongs together as the retaining clip is placed in engagement with the prongs and which thereafter lock the prongs in position to prevent disassembly.

* * * * *

UNITED STATES PATENT AND TRADEMARK OFFICE
CERTIFICATE OF CORRECTION

PATENT NO. : 4,357,061
DATED : November 2, 1982
INVENTOR(S) : John B. Crosby

It is certified that error appears in the above–identified patent and that said Letters Patent are hereby corrected as shown below:

Claim 16, line 5, delete "9, 14 or 11" and insert --10, 13 or 14--.

Signed and Sealed this

Thirtieth Day of August 1983

[SEAL]

Attest:

GERALD J. MOSSINGHOFF

Attesting Officer     Commissioner of Patents and Trademarks